United States Patent
Thei et al.

[11] Patent Number: 6,046,103
[45] Date of Patent: Apr. 4, 2000

[54] BORDERLESS CONTACT PROCESS FOR A SALICIDE DEVICES

[75] Inventors: Kong-Beng Thei, Hshin Chu; Ming-Dar Lei; Shou-Gwo Wuu, both of Hsin-Chu, all of Taiwan

[73] Assignee: Taiwan Semiconductor Manufacturing Company, Hsin-Chu, Taiwan

[21] Appl. No.: 09/365,983

[22] Filed: Aug. 2, 1999

[51] Int. Cl.[7] .................................................. H01L 21/4763
[52] U.S. Cl. .......................... 438/624; 438/625; 438/303; 438/305; 438/307
[58] Field of Search ..................................... 438/301, 303, 438/304, 305, 306, 307, 624, 625

[56] References Cited

U.S. PATENT DOCUMENTS

| | | | |
|---|---|---|---|
| 5,268,330 | 12/1993 | Givens et al. | |
| 5,514,626 | 5/1996 | Hickernell et al. | |
| 5,605,862 | 2/1997 | Givens et al. | 437/180 |
| 5,652,176 | 7/1997 | Maniar et al. | 437/67 |
| 5,677,231 | 10/1997 | Maniar et al. | 437/67 |
| 5,698,473 | 12/1997 | Ibok et al. | |
| 5,757,077 | 5/1998 | Chung et al. | 257/736 |
| 5,759,867 | 6/1998 | Armacost et al. | 437/195 |
| 5,840,624 | 11/1998 | Jang et al. | 438/624 |
| 5,856,694 | 1/1999 | Kurichi | 257/360 |
| 5,863,707 | 1/1999 | Lin | 430/313 |
| 5,872,061 | 2/1999 | Lee et al. | 438/705 |

*Primary Examiner*—Wael Fahmy
*Assistant Examiner*—Long Pham
*Attorney, Agent, or Firm*—George O. Saile; Stephen B. Ackerman

[57] ABSTRACT

A process for forming a borderless contact opening to an active device region, overlaid with a metal silicide layer, has been developed. The borderless contact opening is formed in a composite insulator layer, comprised with an overlying, thick ILD layer, and a thin, underlying silicon oxynitride layer. The thin silicon oxynitride layer, used as a etch stop layer, during the anisotropic RIE procedure used to form the borderless contact opening, is deposited at a temperature below 350° C., to prevent agglomeration of the metal silicide layer.

15 Claims, 2 Drawing Sheets

BORDERLESS CONTACT PROCESS FOR A SALICIDE DEVICES

BACKGROUND OF THE INVENTION

(1) Field of the Invention

The present invention relates to methods used to fabricate semiconductor devices, and more specifically to a process used to create a borderless contact opening, to a salicide surface.

(2) Description of Prior Art

The semiconductor industry is continually striving to reduce the processing cost of a specific semiconductor chip, by reducing the size of the chip, while still maintaining, or increasing the device density of that specific semiconductor chip. The attainment of additional chips, from a specific size starting semiconductor substrate, reduces the processing cost of a specific chip. The attainment of smaller semiconductor chips has been in part a result of micro-miniaturization, or the ability to fabricate semiconductor chips using sub-micron features. Micro-miniaturization has been accomplished via advancements in specific semiconductor fabrication procedures, such as photolithography and reactive ion etching. More sophisticated exposure tools, and the development of more sensitive photoresist materials, have allowed sub-micron images to be routinely achieved in photoresist layers. In addition the development of advanced dry etching tools and processes, have allowed the sub-micron images, in masking photoresist layers, to be transferred to underlying materials, such a silicon oxide, silicon nitride, and polysilicon, creating these materials, with sub-micron features, this resulting in smaller semiconductor chips, still possessing higher device densities than counterparts fabricated using larger features.

However in addition to the contributions to the attainment of micro-miniaturization, offered by advances in fabrication disciplines, specific structural developments have also positively influenced the attainment of smaller, higher device density, semiconductor chips. The use of a borderless contact, or an opening not fully landed on the underlying material being exposed in the contact hole, has contributed to the pursuit of micro-miniaturization. If a fully landed contact opening were used, the ground rules, or design, insuring the attainment of a fully landed contact opening, would adversely influence device density, therefore the borderless, or not fully landed contact hole, approach is used. Since the borderless contact opening will expose an underlying, material, such as an insulator, as well as exposing the desired underlying material, such as a conductive region of an active device region, special care most be used during the reactive ion etching, (RIE), procedure, used to open the borderless contact, in terms of selectivity to both materials. Therefore thin etch stop layers, such as silicon nitride, are used to allow monitoring of the RIE procedure, allowing a first phase of the RIE the procedure, used to create an opening in a silicon oxide layer, to slow or terminate at the appearance of the silicon nitride layer. A second phase of the RIE procedure is than used that will selectively remove the silicon nitride stop layer, without attacking insulator material, such as silicon oxide, exposed along with silicon, or metal silicide material, at the bottom of the borderless contact opening.

A critical problem encountered however, is the combination of silicon nitride stop layers, overlying metal silicide layers, such as titanium silicide, located on the surface of active device regions. The use of silicon nitride layers, formed in a furnace at a temperatures greater than about 650° C., can result in a metal silicide agglomeration phenomena, changing the continuos metal silicide layer to a layer comprised with masses or balls of the metal silicide, resulting in significant increases in metal silicide resistance, thus adversely influencing device performance. This invention will describe a borderless contact process, using a silicon oxynitride layer, as a stop layer, for the first phase of the RIE procedure, used the borderless contact. The silicon oxynitride layer, obtained via chemical vapor deposition procedures, at a temperature of about 350° C., will offer the desired RIE etch selectively, without initiating metal silicide agglomeration, thus maintaining low metal silicide resistance. Prior art, such a Jang et al, in U.S. Pat. No. 5,840,624, offer a borderless contact procedure, however that prior art does not open borderless contacts to metal silicide layers, therefore metal silicide agglomeration is not a concern, in addition to that prior art not using the novel, low temperature silicon oxynitride etch stop layer, overlying a metal silicide layer.

SUMMARY OF THE INVENTION

It is an object of this invention to form a borderless contact opening, to an active device region of a metal oxide semiconductor field effect transistor, (MOSFET), device, where the metal silicide layer resides on the top surface of the active device region.

It is another object of this invention to use a silicon oxynitride layer, as a stop layer, allowing a first phase of a selective, reactive ion etching, (RIE), procedure, to create the borderless contact opening, in a thick insulator layer, exposing the underlying silicon oxynitride stop layer, than using a second phase of the RIE procedure, to complete the opening of the borderless contact hole, via selective removal of the silicon oxynitride stop layer.

It is still another object of this invention to deposit the silicon oxynitride stop layer, at a temperature of 350° or below, to prevent metal silicide agglomeration.

In accordance with the present invention a method of forming a borderless contact opening, in a composite insulator layer, to an active device region covered with a metal silicide layer, in which the composite insulator layer is comprised with a thin, underlying, silicon oxynitride layer, used as a stop layer, for the borderless contact, dry etching procedure, is described. After forming a transfer gate transistor, comprised of a polysilicon gate structure, on an underlying gate insulator layer, and source/drain regions, in a region of the semiconductor substrate, not covered by the polysilicon gate structure, self-aligned metal silicide layers are formed on the top surface of the polysilicon gate structure, and on the top surface of the source/drain regions. A thin silicon oxynitride layer is next deposited, at a temperature of 350° or less, at a growth rate of about 200 Angstroms/min, followed by the deposition of an overlying, thick insulator layer. Conventional photolithographic patterning procedures, and a first phase of a selective RIE procedure, are than used to create a borderless contact opening, in the thick insulator layer, exposing the top surface of the thin silicon oxynitride layer. A second phase of the RIE procedure, results in removal of the thin silicon oxynitride layer, exposing a portion of the top surface of metal silicide layer on an active device region, as well as exposing a portion of an isolation region, comprised of silicon oxide. A metal plug structure, is then formed in the borderless contact opening, overlying and contacting, the top surface of the portion of the active device region, overlaid with metal silicide, exposed in the borderless contact opening.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

Figure 1:
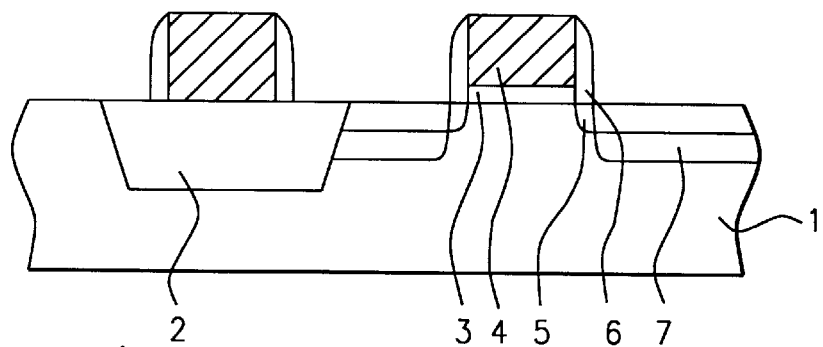
FIGS. 1–5, which schematically, in cross-sectional style, show the key stages of fabrication used to create a borderless contact opening, in a composite insulator layer comprised with an underlying, thin, silicon oxynitride, stop layer, exposing a portion of an active device region, overlaid with metal silicide.

The method of forming a borderless contact opening, in a composite insulator layer, exposing a portion of an active device region, covered with metal silicide, and where the composite insulator layer is comprised with a thin silicon oxynitride layer, used a stop layer, during the borderless contact opening, RIE procedure, will now be described in detail. A P type, single crystalline semiconductor substrate 1, is used and shown schematically in FIG. 1. An isolation region 2, comprised of either a silicon oxide filled, shallow trench, or a thermally grown, silicon dioxide, field oxide region, is next formed in a region of semiconductor substrate 1. Iolation region 2, can be comprised of a silicon oxide, shallow trench region, or of a thermally grown, field oxide region. A silicon dioxide gate insulator layer 3, is thermally grown, at a thickness between about 50 to 200 Angstroms, followed by the deposition of, and the patterning of, a polysilicon layer, resulting in polysilicon gate structure 4. The polysilicon layer is deposited via low pressure chemical vapor deposition, (LPCVD), procedure, to a thickness between about 1500 to 3000 Angstroms, and either doped in in situ, during deposition, via the addition of arsine, or phosphine, to a silane ambient, or deposited intrinsically, then doped via ion implantation of arsenic, or phosphorous ions. Patterning of the polysilicon layer, to create polysilicon gate structure 4, is accomplished via conventional photo-lithographic and RIE procedures, using $Cl_2$ as an etchant. If desired a polycide, (metal silicide—polysilicon), gate structure, can be used in place polysilicon gate structure 4, offering lower word line resistance.

Figure 2:
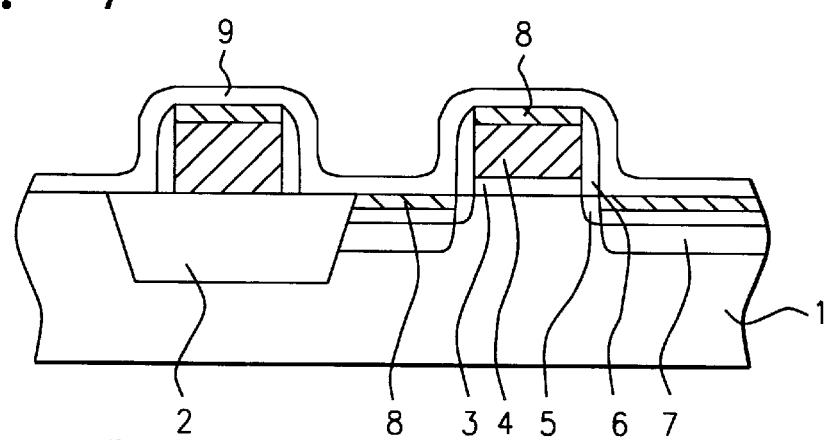

After removal of the photoresist shape, used for definition of polysilicon gate structure 4, a lightly doped source/drain region 5, is formed via the ion implantation of arsenic, or phosphorous ions, at an energy between about 30 to 50 KeV, at a does between about 1E13 to 1E14 atoms/$cm^2$. An insulator layer, such as silicon oxide, or silicon nitride, is next deposited via LPCVD or plasma enhanced chemical vapor deposition, (PECVD), procedures, at a thickness between about 1000 to 3000 Angstroms. An anisotropic RIE procedure, using $CHF_3$ or $CF_4$ as an etchant, is used to create insulator spacers 6. Another ion implantation procedure, again using arsenic or phosphorous ions, at an energy between about 40 to 60 KeV, and at a dose between about 1E14 to 1E16 atoms/$cm^2$, is used to create heavily doped source/drain region 7, schematically shown in FIG. 1. Although this invention is shown applied to a N channel device, the borderless contact opening, described in this invention can also be applied to P channel devices FIG. 2, schematically shows the formation of a self-aligned metal silicide layer 8, on exposed silicon, and polysilicon surfaces. This is accomplished via the deposition of a metal layer, such as titanium, at a thickness between about 250 to 400 Angstroms, via plasma vapor deposition procedures. A first rapid thermal anneal procedure, (RTA), performed in a nitrogen ambient, at a temperature between about 650 to 750° C., for a time between about 20 to 40 sec, is used to convert the regions of metal, overlying heavily doped, source/drain region 7, and overlying the top surface of polysilicon gate structure 4, to metal silicide layer 8. Regions of the metal layer residing on insulator spacers 6, or isolation region 2, remain unreacted. Selective removal of the unreacted metal is next accomplished using a solution comprised with $H_2O_2$, $H_2SO_4$, $NH_4OH$, and $H_2O$, at a temperature between about 60 to 100° C. A second RTA procedure, again performed a nitrogen ambient, at a temperature between about 850 to 900° C., for a time between about 20 to 40 sec, to reduce the resistance of metal silicide layer 8. Counterparts, using furnace grown, silicon nitride stop layers, need a temperature between about 650 to 780° C., for a time between about 60 to 90 min, to grow 400 Angstroms of the stop layer. Metal silicide layer 8, may also be comprised of cobalt silicide, or tantalum silicide.

A critical feature of this invention, the deposition of a thin insulator layer, to be used as a stop layer, during a subsequent borderless contact opening, is next addressed. A silicon oxynitride layer, is used as the thin, insulator stop layer. Silicon oxynitride layer 9, will offer the etch rate selectivity needed during a RIE procedure, used for the subsequent borderless contact opening, and of upmost importance, can be deposited at temperature low enough to avoid agglomeration of the underlying metal silicide layers. Silicon oxynitride layer 9, shown schematically in FIG. 2, is deposited at a temperature between about 300 to 350° C., to a thickness between about 350 to 450 Angstroms, using a deposition rate of about 175 to 225 Angstroms/min. The combination of low temperature, and the short period of time used to deposit silicon oxynitride, prevent the undesired metal silicide agglomeration phenomena from occurring. Counterparts fabricated using furnace grown silicon nitride as a stop layer, formed at a temperature between about 680 to 750° C., can lead to metal silicide agglomeration. The use of furnace grown silicon nitride results in undesirable agglomeration evidenced by the sheet resistance of a metal silicide/polysilicon gate structure, of about 8 ohms/square, compared to the identical metal silicide/polysilicon gate structure, overlaid with the low temperature silicon oxynitride layer, presenting a sheet resistance of between about 3 to 4 ohm/square. The agglomeration phenomena is also observed for metal silicide/source-drain regions, overlaid with furnace grown silicon nitride, resulting in a sheet resistance of about 60 ohms/square, compered to counterparts overlaid with the low temperature, silicon oxynitride, stop layers, resulting in a sheet resistance of between about 10 to 15 ohms/square.

Figure 3:
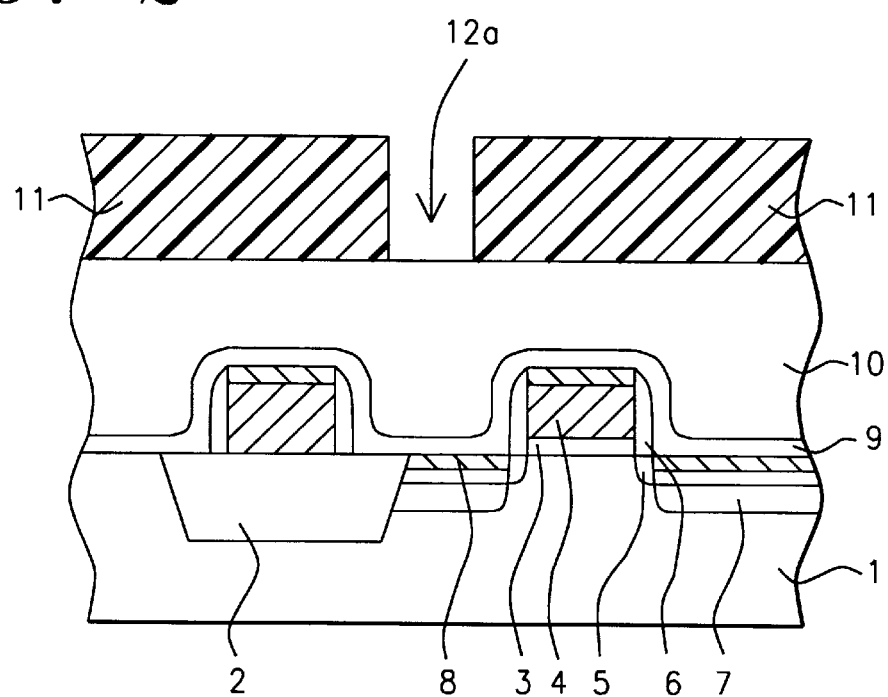
Figure 4:
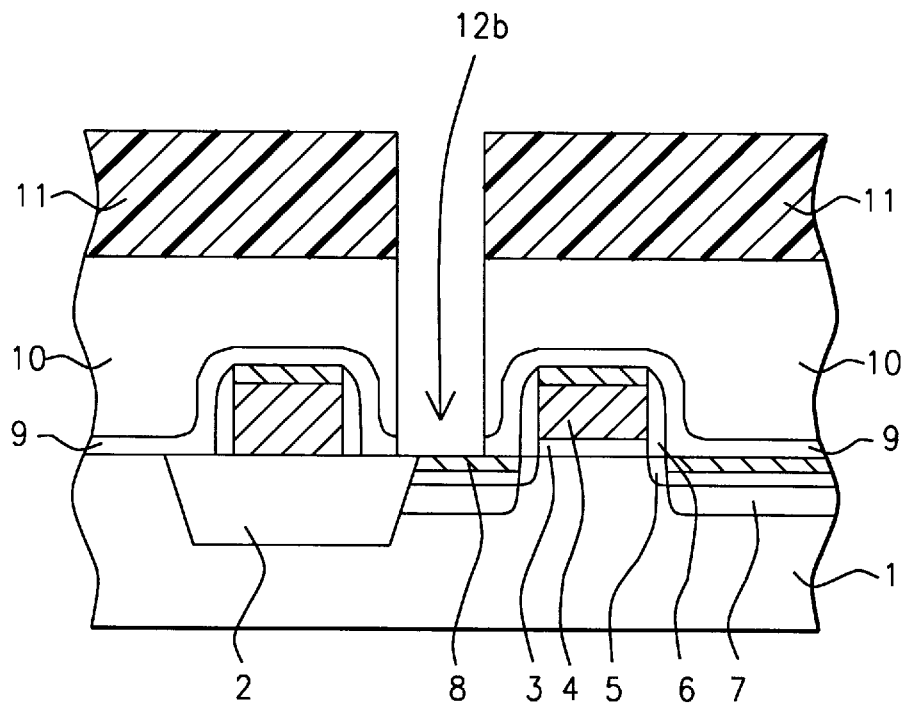

An interlevel dielectric, (ILD), layer 10, comprised of silicon oxide, is next deposited via PECVD or LPCVD procedures, to a thickness between about 7000 to 9000 Angstroms. ILD layer 10, shown schematically in FIG. 3, can also be comprised of borophosphosilicate glass, (BPSG). ILD layer 10, similarly to silicon oxynitride layer 9, is deposited at a temperature between about 350 to 450° C., again at a temperature below which undesirable metal silicide agglomeration will occur. A chemical mechanical polishing procedure is then employed for planarization purposes, resulting in a smooth top surface topography for ILD layer 10. Photoresist shape 11, is formed on ILD layer 10, featuring opening 12a, which will allow the subsequent borderless contact opening to be formed in ILD layer 10, and in silicon oxynitride layer 9. A selective RIE procedure, using $CHF_3$ as an etchant, is used to remove the region of ILD layer 10, exposed in opening 12a, in photoresist shape 11. The etch rate ratio of ILD layer 10, (silicon oxide), to silicon oxynitride, is about 7 to 1, allowing this first phase of the RIE procedure, the removal of ILD layer 10, to be monitored by the appearance of silicon oxynitride layer 9. A second RIE phase, using $CO—O_2—C_2F_6$ as an etchant, is then used to selectively remove exposed regions of silicon oxynitride layer 9, resulting in borderless contact opening 12b, shown schematically in FIG. 4. The etch rate ratio of silicon oxynitride to metal silicide is about 70 to 1, while the etch rate ratio of silicon oxynitride to silicon oxide, in this RIE ambient is about 7 to 1, allowing endpoint for the second phase of RIE procedure, used to create borderless contact opening 12b, to be determined by the appearance of the metal silicide layer. The etch stop characteristics of silicon oxynitride layer 9, allowed borderless contact opening 12b, to be successfully formed without unwanted overetch of the underlying metal silicide layer 8, or the overetch of silicon oxide region 2, in addition the use of a silicon oxynitride stop layer, obtained via a low temperature, high deposition rate process, prevented agglomeration of metal silicide layer 8, thus preserving the desired conductivity supplied by the metal silicide material.

Figure 5:
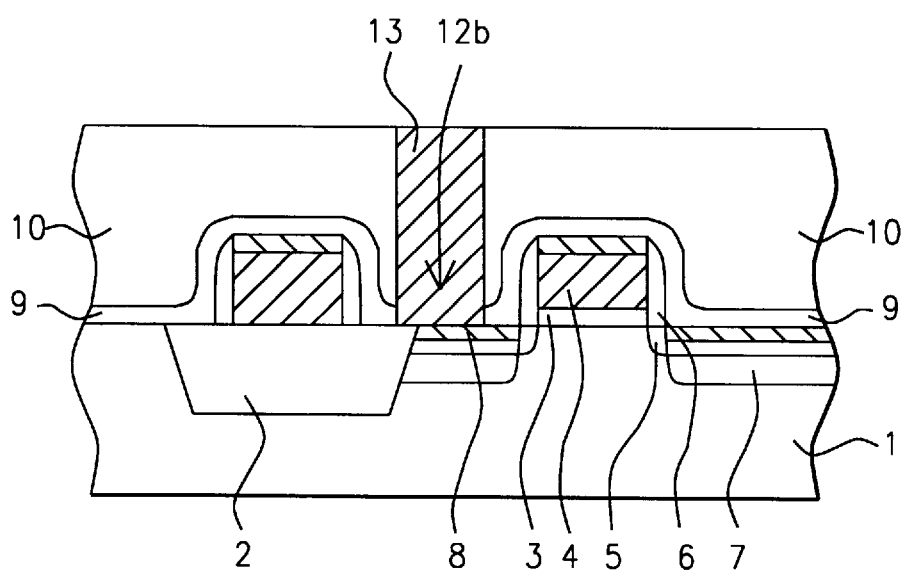

The creation of metal plug structure 13, in borderless contact opening 12b, is next addressed and described schematically in FIG. 5. After removal of photoresist shape 11, used to define borderless contact opening 12b, via plasma oxygen ashing and careful wet cleans, a metal layer is deposited, completely filling borderless contact opening 12b. The metal layer can be comprised of tungsten, obtained via chemical vapor deposition, or plasma vapor deposition procedures, at a thickness between about 3000 to 5000 Angstroms. Regions of the metal layer, residing on the top surface of ILD layer 10, are then removed via a chemical mechanical polishing procedure, or via a selective RIE procedure, using $Cl_2$ as an etchant, resulting in metal plug structure 13, in borderless contact opening 12b.

While this invention has been particularly shown and described with reference to, the preferred embodiment thereof, it will be understood by those skilled in the art that various changes in form and details may be made without departing from the spirit or scope of this invention.

What is claimed is:

1. A method of fabricating a borderless contact opening, to a portion of an active device region, of a semiconductor substrate, comprising the steps of:

forming an isolation region in said semiconductor substrate, and forming a transfer gate transistor, comprised of: a gate structure, on an underlying gate insulator layer, insulator spacers on sides of said gate structure, and a source/drain region, located between said isolation region and said gate structure, overlaid with a metal silicide layer;

depositing an insulator stop layer;

depositing a thick insulator layer;

forming said borderless contact opening, in said thick insulator layer, and in said insulator stop layer, exposing a portion of said metal silicide layer, located on said source/drain region, and exposing a portion of said isolation region, via use of a first anisotropic RIE procedure, for said thick insulator layer, using $CHF_3$ as an etchant, with an etch rate ratio of said thick insulator layer to said stop layer, of about 7 to 1, and via a second anisotropic RIE procedure, for said insulator stop layer, using $CO—O_2—C_2F_6$ as an etchant; and forming a metal structure in said borderless contact opening, overlying, and contacting a portion of said metal silicide layer, overlying said source/drain region.

2. The method of claim 1, wherein said isolation region is either a silicon oxide filled, shallow trench region, or a thermally grown, silicon dioxide, field oxide region.

3. The method of claim 1, wherein said gate structure is a polysilicon gate structure, or a polycide, (metal silicide-polysilicon), gate structure.

4. The method of claim 1, wherein said insulator spacers, on the sides of said gate structure, are comprised of either silicon oxide, or silicon nitride.

5. The method of claim 1, wherein said metal silicide layer, located on the top surface of said source/drain region, is either a titanium silicide, cobalt silicide, or tantalum silicide layer.

6. The method of claim 1, wherein said insulator stop layer is a silicon oxynitride layer, obtained via PECVD procedures, at a thickness between about 350 to 450 Angstroms, at a temperature between about 300 to 350° C., with a growth rate of about 175 to 225 Angstroms/min.

7. The method of claim 1, wherein said thick insulator layer is a either a silicon oxide layer, or a borophosphosilicate glass, (BPSG), layer, obtained via PECVD procedures, at a temperature between about 350 to 450° C., and at a thickness between about 7000 to 9000 Angstroms.

8. A method of fabricating a borderless contact opening, in a composite insulator layer, exposing a portion of an active device region, in a semiconductor substrate, with the active device region covered by a metal silicide layer, and with the composite insulator layer comprised with a thin, underlying silicon oxynitride layer, used as a low temperature stop layer during the dry etching procedure, used to create said borderless contact opening, comprising the steps of:

forming an isolation region in said semiconductor substrate;

forming a silicon dioxide gate insulator layer on a region of said semiconductor substrate, not occupied by said isolation region;

forming a polysilicon gate structure;

forming a lightly doped source/drain region in an area of said semiconductor substrate, not covered by said polysilicon gate structure;

forming insulator spacers on sides of said polysilicon gate structure;

forming a heavily doped source/drain region in an area of said semiconductor substrate, not covered by said polysilicon gate structure, or by said insulator spacers;

forming self-aligned titanium silicide layers on a top surface of said polysilicon gate structure, and on a surface of said heavily doped source/drain;

depositing said thin silicon oxynitride layer;

depositing a interlevel dielectric, (ILD), layer;

planarizing said ILD layer;

creating said borderless contact opening in said ILD layer, and in said thin silicon oxynitride layer, exposing a portion of the top surface of the titanium silicide layer residing on the top surface of said heavily doped source/drain region, and exposing a portion of the top surface of said isolation region, via use of an anisotropic RIE procedure, using $CHF_3$ as an etchant for said ILD layer, with an etch rate ratio of said ILD layer, to said thin silicon oxynitride layer, of between 7 to 1, while using $CO—O_2—C_2F_6$ as an etchant for said thin silicon oxynitride layer; and forming a metal structure in said borderless contact opening.

9. The method of claim 8, wherein said isolation region is either a silicon oxide filled, shallow trench, or a thermally grown, silicon dioxide, field oxide region.

10. The method of claim 8, wherein said insulator spacers are comprised of either silicon oxide, or silicon nitride, at a thickness between about 1000 to 3000 Angstroms.

11. The method of claim 8, wherein the sheet resistance of a titanium silicide/heavily doped source/drain region, is between about 10 to 15 ohms/square.

12. The method of claim 8, wherein the sheet resistance of a titanium silicide/polysilicon gate structure is between about 3 to 4 ohms/square.

13. The method of claim 8, wherein said thin silicon oxynitride layer is obtained via PECVD procedures, at a thickness between about 350 to 450 Angstroms, deposited at a temperature between about 300 to 350° C., with a deposition rate of about 175 to 225 Angstroms/min.

14. The method of claim 8, wherein said ILD layer is a silicon oxide layer, obtained via PECVD procedures, at a temperature between about 350 to 450° C., and at a thickness between about 7000 to 9000 Angstroms.

15. The method of claim 8, wherein said ILD layer is a borophosphosilicate layer, obtained via PECVD procedures, at a temperature between about 350 to 450° C., and to a thickness between about 7000 to 9000 Angstroms.

* * * * *